United States Patent [19]
Williams et al.

[11] Patent Number: 5,306,656
[45] Date of Patent: Apr. 26, 1994

[54] METHOD FOR REDUCING ON RESISTANCE AND IMPROVING CURRENT CHARACTERISTICS OF A MOSFET

[75] Inventors: Richard K. Williams, Cupertino; Randolph D. Mah, Fremont, both of Calif.

[73] Assignee: Siliconix incorporated, Santa Clara, Calif.

[21] Appl. No.: 46,058

[22] Filed: Apr. 12, 1993

Related U.S. Application Data

[62] Division of Ser. No. 210,959, Jun. 24, 1988, Pat. No. 5,237,193.

[51] Int. Cl.⁵ .................................. H01L 21/336
[52] U.S. Cl. ............................... 437/44; 437/41; 437/40; 437/43; 437/59; 148/DIG. 126
[58] Field of Search ............... 437/44, 41, 40, 59, 437/43; 148/DIG. 126; 257/336

[56] References Cited

U.S. PATENT DOCUMENTS

| | | | |
|---|---|---|---|
| 4,290,078 | 9/1981 | Ronen | 357/23.4 |
| 4,308,549 | 12/1981 | Yeh | 357/23 |
| 4,630,085 | 12/1986 | Koyama | 357/23.3 |
| 4,642,881 | 2/1987 | Matsukawa et al. | 29/576 B |
| 4,757,362 | 7/1988 | Biwa et al. | 357/23.8 |
| 4,766,474 | 8/1988 | Nakagawa et al. | 357/23.8 |
| 4,904,614 | 2/1990 | Fisher et al. | 437/41 |
| 4,914,051 | 4/1990 | Hurie et al. | 437/59 |
| 4,922,327 | 5/1990 | Mena et al. | 357/23.4 |
| 4,947,232 | 8/1990 | Ashida et al. | 357/53 |
| 5,135,880 | 8/1992 | Fisher et al. | 437/44 |
| 5,156,989 | 10/1992 | Williams et al. | 437/41 |
| 5,229,308 | 7/1993 | Vo et al. | 437/31 |

FOREIGN PATENT DOCUMENTS

| | | |
|---|---|---|
| 58-6175 | 1/1983 | Japan. |
| 62-248256 | 10/1987 | Japan. |
| 63-132478 | 6/1988 | Japan. |

*Primary Examiner*—T. N. Quach
*Attorney, Agent, or Firm*—Skjerven, Morrill, MacPherson, Franklin & Friel

[57] ABSTRACT

Construction and operation method for lightly doped drain MOSFET that has low or minimum drift on-state resistance and maintains high voltage blocking in the off-state. Temperature sensitivity of the electrical properties of the MOSFET are also reduced relative to MOSFETs produced by processes such as SIPOS. Voltage level shifting of p-channel and n-channel MOSFETs, produced according to the invention, relative to another voltage level is easily accomplished.

9 Claims, 10 Drawing Sheets

METHOD FOR REDUCING ON RESISTANCE AND IMPROVING CURRENT CHARACTERISTICS OF A MOSFET

This application is a division of application Ser. No. 07/210,959, filed Jun. 24, 1988, now U.S. Pat. No. 5,237,193.

BACKGROUND OF THE INVENTION

In order to minimize the electric fields present in a MOSFET where the MOS gate overlaps the drain region, a well-known technique called a lightly doped drain (LDD) has been developed. By using LDD termination techniques, field plate-induced breakdown, which normally limits the $BV_{dss}$ to approximately 30 volts, is eliminated and the device is then capable of the full avalanche voltage characteristic of the substrate or epitaxial doping concentration. Breakdown voltages of 30–1200 volts have been achieved using LDD techniques. Furthermore, electron-hole pairs that are crated in a LDD transistor are not swept into the gate oxide as hot carriers, and they do not charge the gate oxide and degrade mobility. LDD structures also exhibit a lower gate-to-drain overlap capacitance because the LDD region behaves as a series capacitor. Lower overlap capacitance improves the switching and the high frequency characteristics of the MOSFET.

Lightly doped drain MOSFETs have been implemented in a number of ways. FIG. 1 shows a conventional high voltage LDD using an ion implanted lightly doped drift region, also known as a lateral charge control region or LCC. Notice the structure is asymmetric; the lightly doped region is implanted only o the drain side. The optimum implant dose may vary depending on substrate concentration but is typically around $10^{12}$ dopant atoms $cm^{-2}$.

FIG. 2 exhibits a similar structure that uses an epitaxial layer to form the charge control region. The advantage of this technique is that a p+ buried layer can be used for additional field shaping in the vicinity of the gate. Because of the tolerances required in the amount of drift charge dose (typically $1-2 \times 10^{12}$ dopant atoms $cm^{-2}$), the thin n— epi layer is normally ion implanted to set the amount of charge in the drift similar to the LDD device in FIG. 1. Because of the field shaping available in this structure it is referred to as a "reduced surface field" or RESURF device.

FIG. 3 illustrates how the LDD concept has been applied to low voltage devices used in VLSI. Transistors with gate lengths below 3 μm have electric fields comparable to the aforementioned high voltage devices, even at 5 volt supply voltages; the LDD concept is useful here as well. Because of the small LDD feature size however, it is not possible on such a structure to mask the drift implant so that it will only appear on the drain side. Instead, the drift is formed by the well known "sidewall spacer technique," where the drift is implanted on both sides of the gate. The poly gate is then oxidized at a low temperature to form a sidewall spacer oxide and the n+ source/drain regions are implanted. The resulting device is symmetric.

In all of the devices described thus far, the addition of the lightly doped drain region improves device breakdown but sacrifices low on-state resistance because the drift region acts as a series resistor. Moreover, under some circumstances the drift region can actually limit the current by pinching off via JFET action. This results in poor $I_d(sat)$ characteristics, as shown in FIG. 4, which compared $I_d$ vs. V characteristics for LDD MOS and for conventional MOS. The equivalent model of the high voltage LDD and RESURF structures is shown in FIG. 5A.

In the low voltage LDD transistor the situation is different. The drift region is more heavily doped than the high voltage transistors so that it is unlikely that enough voltage could be applied to the drift for it to pinch off. The drift region then can be modeled simply as a resistor. Because the device is symmetric, this resistor appears on both the source and drain sides of the transistor. The resistance on the source side constitutes source degeneration, a form of negative feedback that reduces the overall device efficiency. The equivalent low voltage circuit model is illustrated in FIG. 5B.

It is possible to increase the drift region concentration somewhat, but not without degrading device breakdown. Specifically, a more heavily doped drift region increases the electric field near the MOS gate and leads to lower breakdown voltages.

An attempt to avoid a compromise between device breakdown and on-state resistance is described in United Kingdom Patent GB 2150746A. One proposed device, shown in FIG. 6, uses a layer of SIPOS (semi-insulating polycrystalline silicon) covering the drift region to create a surface accumulation region that lowers the effective on-state resistance of the transistor. To form the accumulation region, the SIPOS must have a nonzero voltage across it ($V_{SIPOS} > V_{source}$). The SIPOS is slightly conductive so that it forms a resistor with a small leakage current flowing through it and therefore acts as a voltage divider. In so doing, the SIPOS acts as the high voltage termination by spreading out the equipotentials to maintain the breakdown voltage.

The electrical properties of SIPOS are strongly dependent on temperature. Consequently, at low temperatures it is less conductive (becoming more insulator-like) and no longer functions as a voltage termination to improve breakdown or to reduce on-state resistance. At high temperatures it becomes more conductive, resulting in a large leakage through the SIPOS resistor. The application of SIPOS termination techniques has been severely limited due to this strong temperature dependence.

What is needed here is a method to enhance the conductivity of a drift region without requiring a parasitic leakage current. The subject invention uses a biased conductive field plate positioned over the region to induce a surface accumulation region and reduce the drift resistance during "on-state" conduction; the plate is biased to a different potential when the device is in the "off-state", to maintain high voltage blocking capability. Further, because the invention uses a conductive material such as doped polysilicon or metal already available in the process, no special fabrication steps such as SIPOS are required.

SUMMARY OF THE INVENTION

This invention provides apparatus, and method for its construction, that has low or minimum drift region resistance in the on-state condition of the apparatus and maintains high voltage blocking capability in the off-state condition. Further, the temperature sensitivity of the apparatus is substantially reduced relative to the SIPOS technique discussed above. Further, the resulting apparatus can accommodate an n-channel MOS- FET and a p-channel MOSFET, constructed according to the invention, for which the voltage levels are easily shifted relative to a voltage reference level.

Other purposes of the invention, and advantages thereof, will become clear by reference to the detailed description and accompanying drawings.

These purposes may be realized by apparatus including in one embodiment:

a lightly doped, or undoped, substrate region of first electrical conductivity type that has a top surface; source and drain regions, heavily doped, of second electrical conductivity type, spaced apart, and each forming a part of the top surface of the substrate; an oxide region including a semiconductor oxide material, overlying at least a portion of the source and drain regions and overlying substantially all of the substrate region that lies between the source and drain regions and having a top surface; a gate positioned within the interior of the oxide region and overlying a portion of the substrate region that lies between the source and drain regions and that lies over a high quality gate oxide; a drift region positioned between the source and drain regions and forming a part of the top surface of the substrate, spaced apart from at least one of the source region and drain region and forming a part of the top surface of the substrate region, the drift region having an effective dose of dopant of second conductivity type of between substantially $5 \times 10^{10}$ and $5 \times 10^{12}$ dopant atoms/cm$^2$; and a drift electrode of electrically conducting material positioned adjacent to the top surface of the oxide region overlying at least a portion of the drift region and having a predetermined voltage impressed on the drift electrode with a voltage which enhances the conductivity of the drift when the device is on and with another voltage does not substantially disturb the breakdown voltage during the off condition. Another oxide or nitride may coat the entire device to provide protection from scratches or ionic contamination.

In a second embodiment, the apparatus may include: a p-channel MOSFET and an n-channel MOSFET, each constructed according to the first embodiment, a high voltage supply connected to the source of the p-channel MOSFET; a first resistor connected at one end to the high voltage supply; a second resistor connected at one end to a second end of the first resistor and to the gate of the p-channel MOSFET; a MOSFET with its drain connected to a second end of the second resistor, tis source/body connected to ground, and its gate connected to an input terminal; a buffer with its input terminal connected to the level shift MOSFET gate and its output terminal connected to the n-channel output MOSFET gate; with the second end of the second resistor connected to the drift electrode of both the n-channel and p-channel output MOSFETs; and with the drain of the p-channel MOSFET and the drain of the n-channel MOSFET being connected to an output terminal. Alternatively, the gate of the output n-channel MOSFET may be connected to the drift electrode instead of the output of the buffer.

In a third embodiment, the apparatus may include: a p-channel MOSFET and an n-channel MOSFET, each constructed according to the first embodiment; a high voltage supply connected to the source and body of the p-channel MOSFET; four high voltage MOSFETs composing a high voltage level shift circuit, the first and the second of the MOSFETs being p-channel with their source and body regions connected to the high voltage supply, and third and fourth being n-channel with their source and body regions connected to ground; a logic inverter connected at its input terminal to the gate of the third MOSFET and to the gate of the output n-channel MOSFET and connected at its output terminal to the gate of the fourth MOSFET with the gate of the second MOSFET, the drain of the first and third MOSFET connected together, with the gate of the first MOSFET, drain of the second MOSFET and rain of the fourth MOSFET all connected to the gate of the p-channel output transistor and to the drift electrode of both the p-channel MOSFET and the n-channel MOSFET; with the source and body of the n-channel output MOSFET connected to ground; and with the drain of the p-channel MOSFET and the drain of the n-channel output MOSFET each connected to an output terminal. Alternatively the gate of the output n-channel MOSFET may be connected to the drift electrode rather than the input of the inverter.

DESCRIPTION OF THE INVENTION

Figure 1:
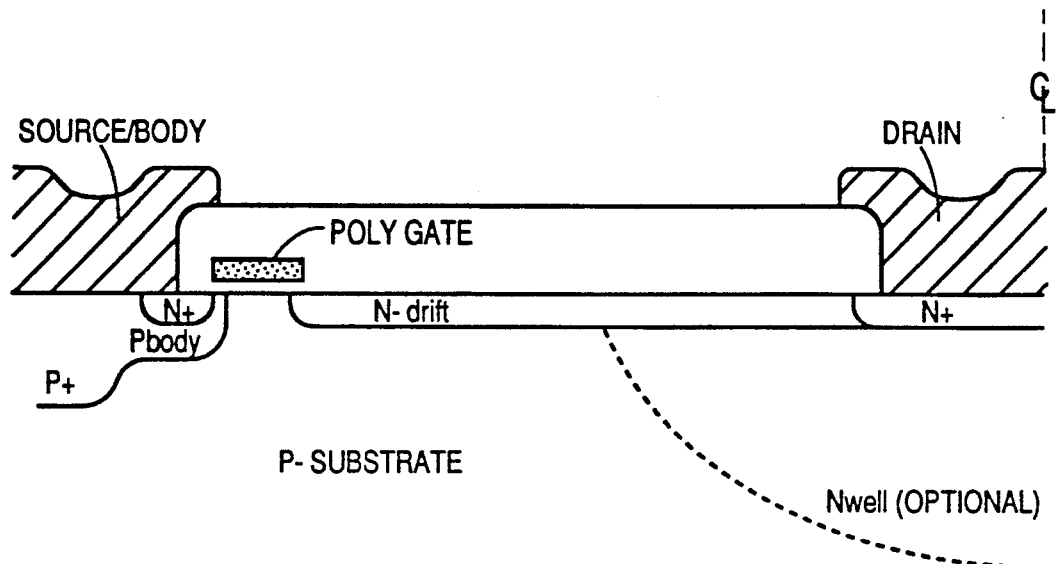
FIG. 1 is a schematic view of a high voltage, lightly doped drain MOSFET in the prior art.
Figure 2:
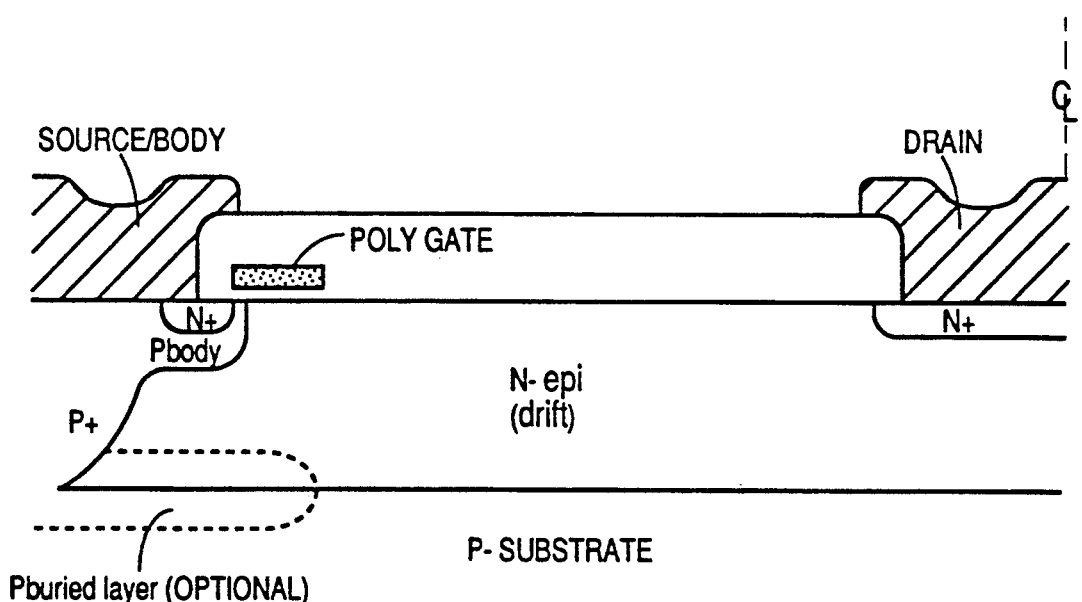
FIG. 2 is a schematic view of a high voltage RESURF MOSFET in the prior art.
Figure 3:
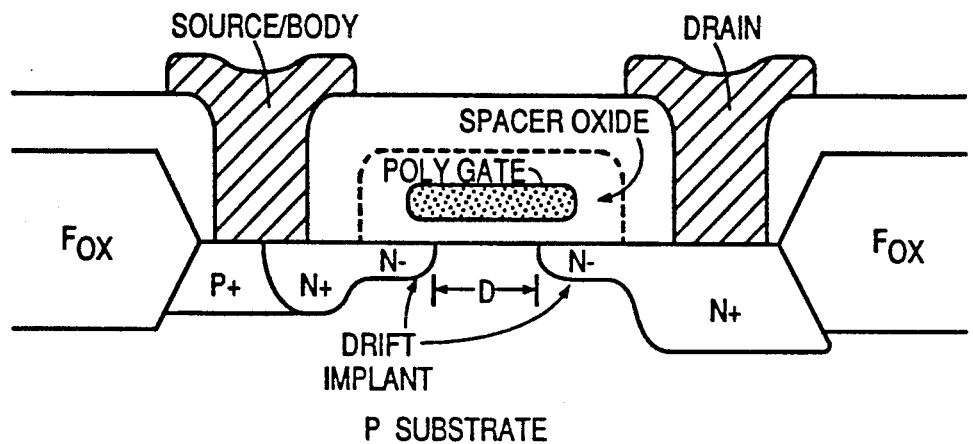
FIG. 3 is a schematic view of a low voltage oxide sidewall spacer, as used with a lightly doped drain MOSFET in the prior art.
Figure 4:
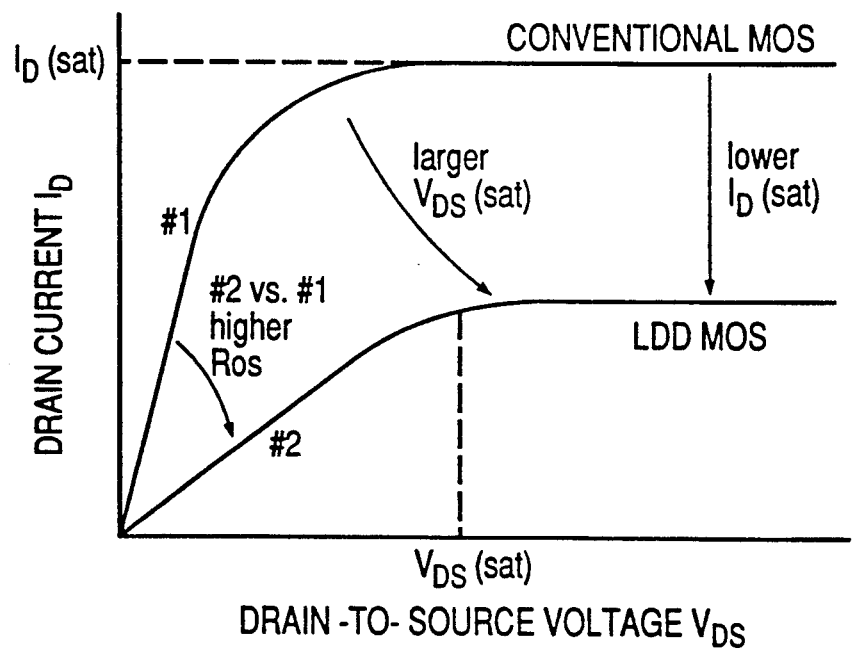
FIG. 4 is a graphic view comparing the current vs. voltage characteristics of a conventional MOSFET and a lightly doped drain MOSFET in the prior art.
Figure 5A:
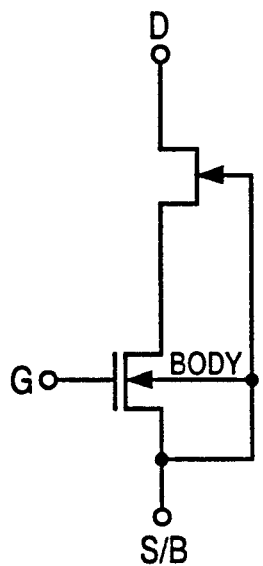
FIGS. 5A and 5B illustrate equivalent high voltage and low voltage, respectively, lightly doped drain models in the prior art.
Figure 5B:
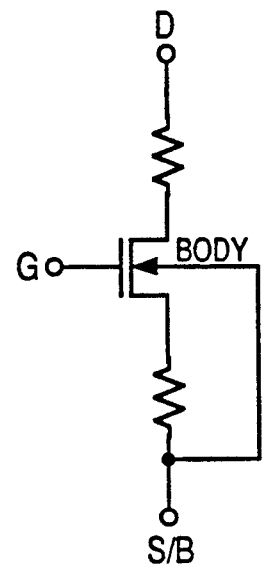
Figure 6:
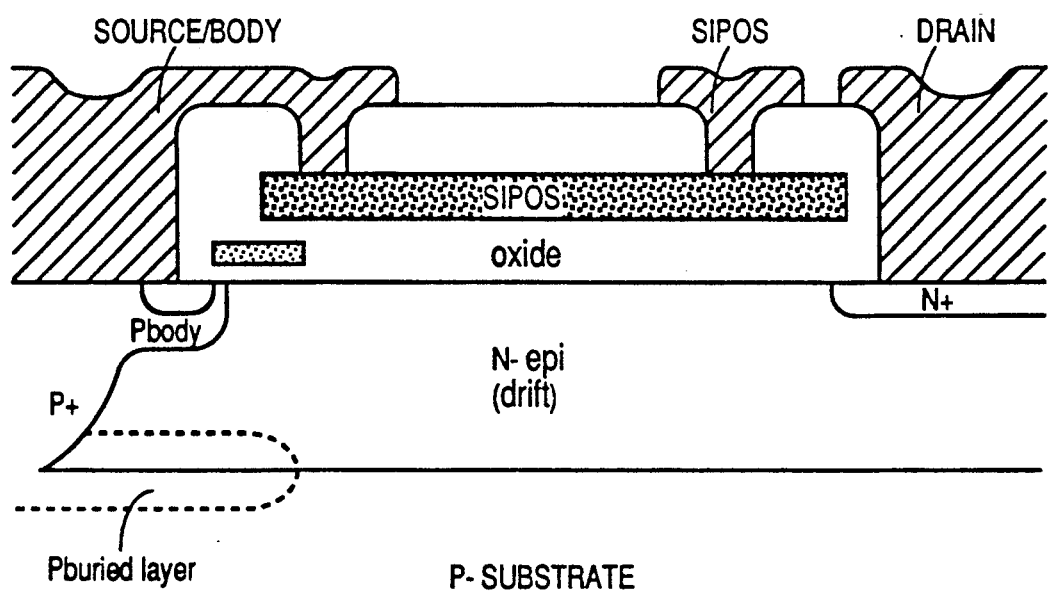
FIG. 6 is a schematic view of a high voltage RESURF MOSFET that incorporates a semi-insulating polycrystalline silicon region over the drift region in the prior art.
Figure 7:
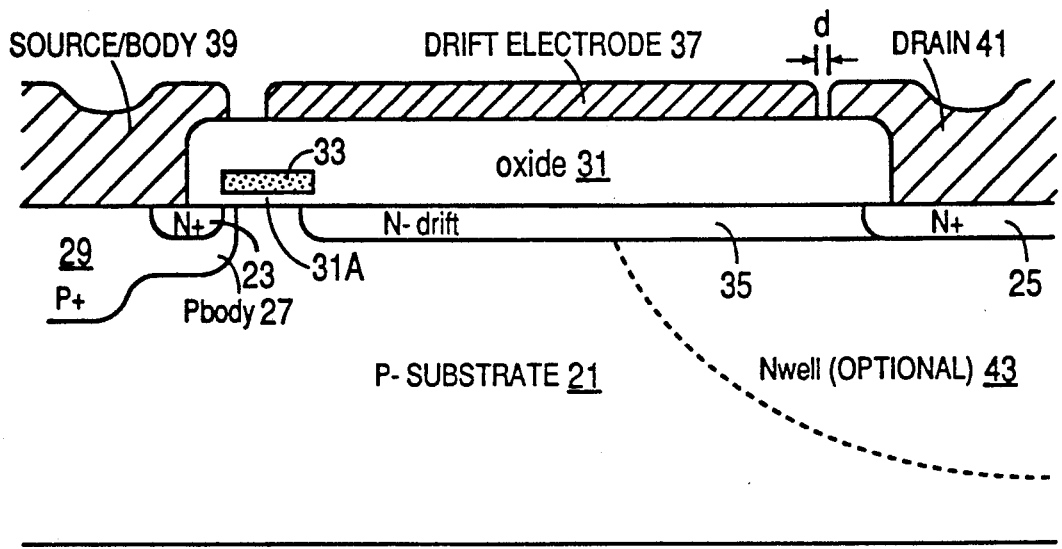
FIG. 7 is a schematic view of a high voltage, lightly doped drain lateral DMOS transistor with a drift electrode incorporated according to one embodiment of the invention.

FIG. 7 illustrates one embodiment of the invention, where a lightly doped drain extension of a high-voltage n-channel lateral DMOSFET is largely or entirely covered by a conductive electrode ("drift electrode"), either of metal such as aluminum or of a heavily doped polysilicon layer.

A lightly doped (p−) substrate 21 has a heavily doped (n+) source region 23 and a heavily doped (n+) drain region 25 formed in the top surface of the substrate 21 and spaced apart from one another. Within, and adjacent to the top surface of, the substrate 21, a normally doped (p) MOSFET body region 27 is formed that surrounds the source region 23 so that the source region 23 is an island in the body region 27. Optionally, a heavily doped (p+) region 29 located in the top surface of the substrate 21 is formed contiguous to and in electrical communication with the body region 27 so that the body region 27 lies between the region 29 and the drain region 25. An oxide region 31, such as $SiO_2$ or a similar electrical insulator, overlies and is substantially contiguous to (1) a portion or all of each of the top surfaces of the source region 23 and drain region 25 and (2) substantially all of the top surface of the substrate 21 that lies between the source region 23 and the drain region 25. A gate 33 composed of electrically conductive material, such as polysilicon, a metal hydride or a metal, is positioned in the interior of the oxide region 31, is spaced apart from all boundaries of the oxide region 31, overlies a portion of the source region 23, and extends within the oxide region 31 and over a thin gate oxide sub-region 31A, toward the drain region 25. The thin gate oxide sub-region 31A lying between the gate 33 and the nearest part of the substrate 21 may have a thickness of substantially 200–2500 Å and should contain only very clean oxide material, preferably thermally oxidized at a temperature of T=900°–1200° C.; this sub-region 31A is present in all embodiments herein. The remainder of the oxide region 31 may contain standard thermal or low temperature oxide, deposited using chemical vapor deposition techniques. The gate 33 covers only a portion, not all, of the top surface of the substrate 21 lying between the source region 23 and the drain region 25. A lightly doped (n−) drift region 35 is formed in the top surface of the substrate 21 in the region between the source region 23 and the drain region 25. A portion of the gate 33 overlies one end of the drift region so that the drift region 35 may be spaced apart from the source region 23. A drift region 35 contiguous to the drain region 25 is spaced apart from the source region 23. Conversely, a drift region contiguous to the source region 23 is spaced apart from the drain region 25. Majority charge carriers (here, electrons) flow between the source region 23 and the drain region 25 in the lightly doped drift region 35, with the flow characteristics being controlled in part by the voltage imposed on the gate 33. A drift electrode 37 of electrically conductive material is positioned adjacent to the top surface of the oxide region 31 and overlies part or all of the drift region 35. The drift electrode 37 is spaced apart from the source region 23, and any electrical contact 39 thereto, and is spaced apart from the drain region 25, and any electrical contact 41 thereto. An n well 43 may, optionally, surround the drain region 25 and cover a portion of the drift region 35 from below within the substrate 21 to provide a higher breakdown voltage and lower on-resistance. The device shown in any of FIGS. 7, 8, 9, 10, 11, 12, 13, 14 may also be formed by replacing p-doped material by n-doped material and replacing n-doped material by p-doped material, with the level of doping (light, normal or heavy) remaining, unchanged, and the drift electrode will provide the same effects.

The drift electrode 37 is electrically isolated from the underlying silicon region by the oxide region 31 of thickness substantially 0.1–4 μm. The gate 33 is usually positioned in the interior of this oxide layer, separated from the substrate and drift regions by a high quality gate oxide 31a of thickness, 0.02–0.25 μm.

When the n-channel device is off, both the MOS gate 33 and the drift electrode 37 are biased to ground potential. Consequently, no channel is formed under the polysilicon gate region and the transistor is off. Because the drift electrode 37 is biased at ground, the conductivity of the n-drift region 35 is not enhanced and it functions normally. Because the drift electrode 37 extends to a point adjacent to the drain region 25, the equipotential lines may become crowded in the drain area, resulting in a higher electric field and a degradation in device breakdown voltage. See FIG. 8, which illustrates this.

Figure 9:
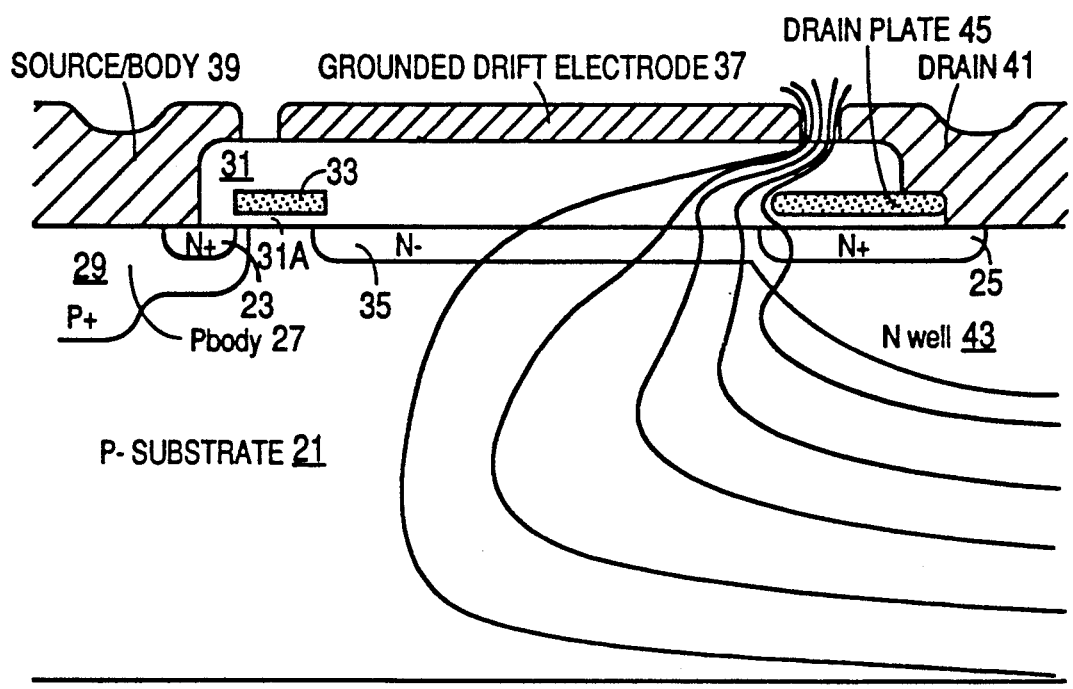
FIG. 9 is a schematic view of a high voltage, lightly doped drain MOSFET according to a second embodiment of the invention, showing the reduction of crowding of the equipotential lines in FIG. 8 by incorporation of a drain plate.

The breakdown voltage can be restored by separating the drift electrode 37 form the edge of the drain region 25 by a larger distance d or by using a polysilicon or metal extension field plate 45 ("drain plate") as a shield, as shown in FIG. 9. For field oxide thicknesses normally available in IC processes, such a technique is not necessary for devices having breakdown voltages below 160 volts.

Figure 9A:
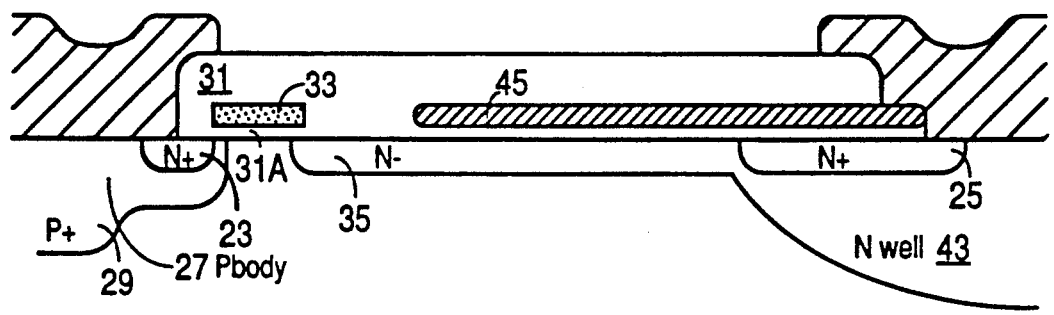
FIG. 9A is a schematic view of an alternative to the embodiment of FIG. 9, wherein the drift electrode is removed and the drain plate serves the function of a drift electrode.

Provided that the transistor is being used as a switch in the on-state, the transistor behaves as a linear resistor with minimum possible drain-source voltage $V_{ds}$; the MOSFET is not saturated. The on-state is achieved by biasing the MOS gate to some positive potential typically 5–15 volts above the threshold voltage. To reduce the resistive contribution of the n− drift region 35, the drift electrode 37 must be biased to a positive potential and preferably, but not necessarily, to a voltage more positive than the gate electrode. In so doing, the n− drift region 35 becomes accumulated with additional electrons and its resistance is decreased. FIG. 9A illustrates an alternative to the embodiment of FIG. 9, wherein the drift electrode at the top surface of the oxide region 31 is removed and the drain plate 45, composed of metal or polysilicon, extends over most or all of the drift region 35.

Figure 8:
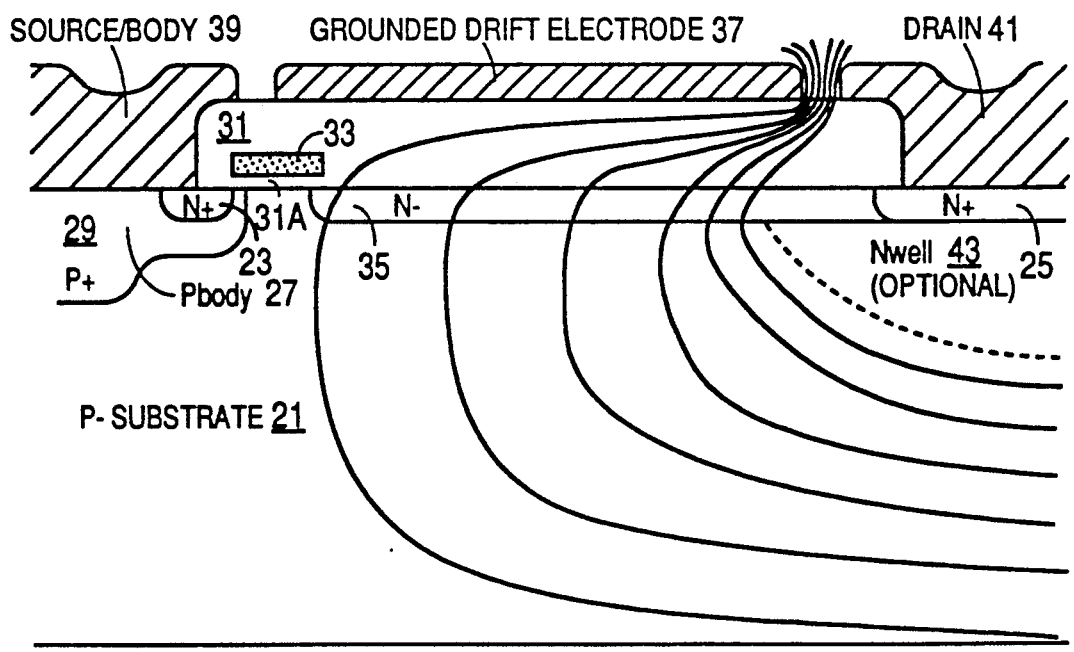
FIG. 8 is a schematic view of a high voltage, lightly doped drain MOSFET according to the invention, showing the shape of equipotential lines with the drift electrode grounded in the off state.
Figure 10:
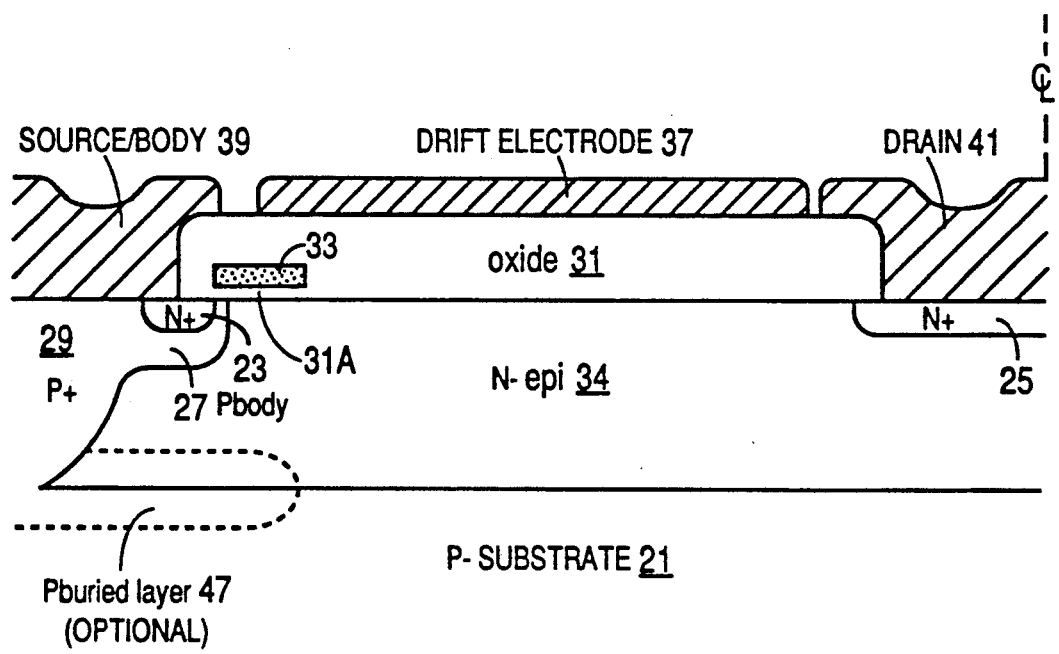
FIG. 10 is a schematic view of a high voltage RESURF MOSFET incorporating the drift electrode of the invention.
Figure 11:
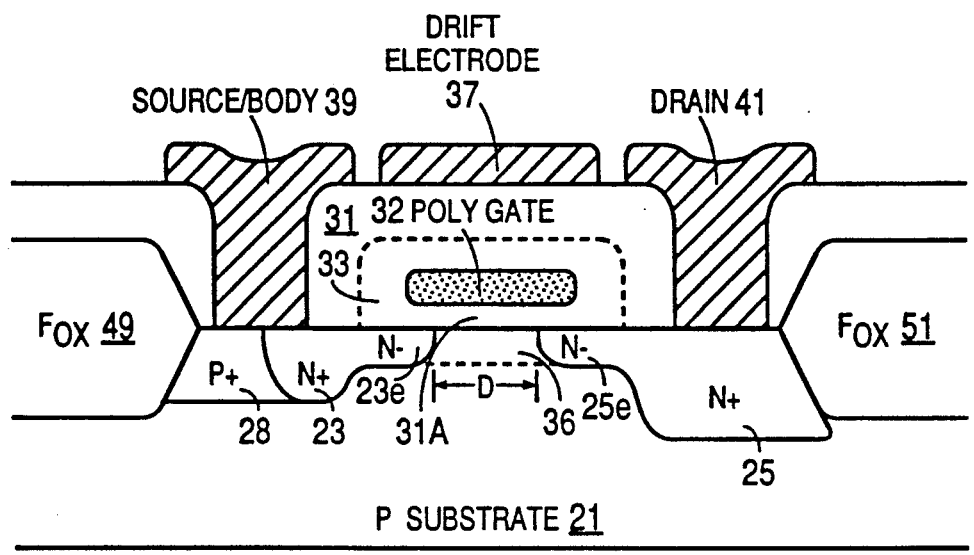
FIG. 11 is a schematic view of an embodiment using an oxide side wall spacer with a lightly doped drain MOSFET and incorporating the drift electrode of the invention.
Figure 12:
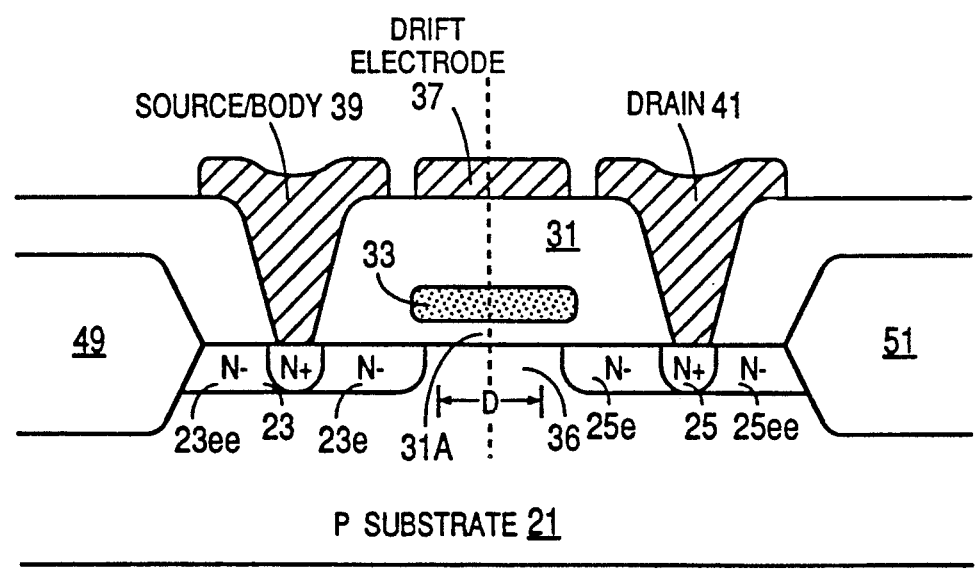
FIG. 12 is a schematic view of a low voltage, substantially symmetric embodiment that uses lightly doped source and drain extensions and incorporates the drift electrode.

This technique, providing a drift electrode overlying part or all of the lightly doped drift region and (optionally) over part of the heavily doped drain region as in FIGS. 7 and 8, extends to other lightly doped drift region devices such the RESURF device shown in FIG. 10 or the sidewall spacer device shown in FIG. 11, or mask-defined-device shown in FIG. 12.

In the RESURF version shown in FIG. 10, the source region 23, drain region 25, body region 27, heavily doped substrate contact region 29, oxide region 31, thin gate oxide sub-region 31A, gate 33 and drift electrode 37 are positioned as in FIG. 7. The top lightly doped (n−) epitaxial layer 34 (of thickness substantially 0.2-15 μm) is grown on the substrate 31 and includes the regions 23, 25, 27 and 29, and a heavily doped buried layer 47 (p+) which is (optionally) formed adjacent to and straddling the substrate-epi layer interface and electrically communicating with the heavily doped region 29 to provide a reduction of electric field under the gate and higher breakdown voltages.

Figure 10A:
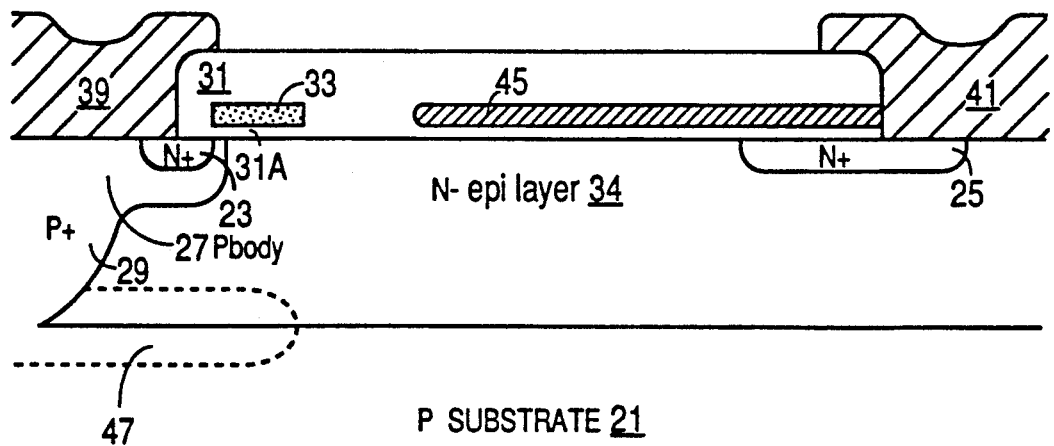
FIG. 10A is a schematic view of an alternative to the embodiment of FIG. 10, wherein the drift electrode is removed and a drain pipe serves as a drift electrode.

FIG. 10A illustrates an alternative to the embodiment of FIG. 10, wherein the drift electrode 37 (whose voltage is independent of the drain voltage) is replaced by a drain plate 45 that is electrically connected to the drain 25 or drain electrical contact 41. The voltage of the drift electrode 37 shown in FIGS. 7, 8, 9, 10, 11, 12, 13, 14 and 15 is electrically connected to a power supply (not shown) that can be used to change the drift electrode from a positive voltage for an n-channel device (negative voltage for a p-channel device) that enhances conductivity in the on-state, to a nominal ground voltage when the device is off in order not to enhance conductivity in the drift or epitaxial region.

FIG. 11 shows schematically the use of a drift electrode according to the invention with a low voltage, lightly doped drain MOSFET, using an oxide sidewall spacer. The substrate 21, source region 23, drain region 25, oxide region 31, thin gate oxide sub-region 31A, sidewall spacer oxide 32, gate 33, drift electrode 37, source/body electrical contact 39 and drain electrical contact 41 are positioned as before. The source region 23 has an adjacent source extension region 23e and the drain region 25 has an adjacent drain extension region 25e. These extension regions 23e and 25e are spaced apart but typically extend 0.1 to 1.0 μm beyond the n+ regions 23 and 25 toward one another and define a channel region 36 of length L= 0.1-20 μm (part of the p substrate 21) lying between the extension regions 23e and 25e at the top surface of the substrate 21. A spacer oxide 32 completely surrounds the gate 33 and lies within the oxide region 31. The material that forms the spacer oxide region 32 differs from the material that forms the oxide region 31 in that it is grown by wet thermal oxidation, typically at low temperatures (e.g., below 950° C.). A heavily doped (p+) region 28 is positioned contiguous to the source region 23, but on an opposite side of 23 from the source extension region 23e, to provide an optional source and body contact to the substrate (ground). Field oxide regions 49 and 51 are positioned adjacent to the heavily doped region 28 and the drain region 25, respectively, to provide electrical isolation of the source region 23 and the drain region 25 from other adjacent devices and from one another in the third dimension not shown in the drawing.

FIG. 12 is a schematic view of a medium voltage (15 to 80 volts) symmetric embodiment of the invention, with the substrate 21, source region 23, first source extension region 23e, drain region 25, first drain extension region 25e, oxide region 31, gate 33, channel region 36, drift electrode 37, source/body contact 39, drain contact 41 and field oxide regions 49 and 51 being positioned substantially as in the embodiment of FIG. 11 but being substantially symmetrically positioned about a center line passing through the gate 33. The source region 23 has a contiguous, lightly doped (n−) second source extension region 23ee located on a side of 23 opposite the first source extension region 23e and extending substantially from the source region 23 to the field oxide region 49. The drain region 25 has a contiguous, lightly doped (n−) second drain extension region 25ee located on a side of 25 opposite to the first source extension region 25e and extending substantially from the drain region 25 to the field oxide region 51. In FIGS. 11 and 12, the presence of the drift electrode 37 may affect the extension regions 23e and 25 e but probably will not affect the channel region 36 lying under the gate 33.

Figure 13:
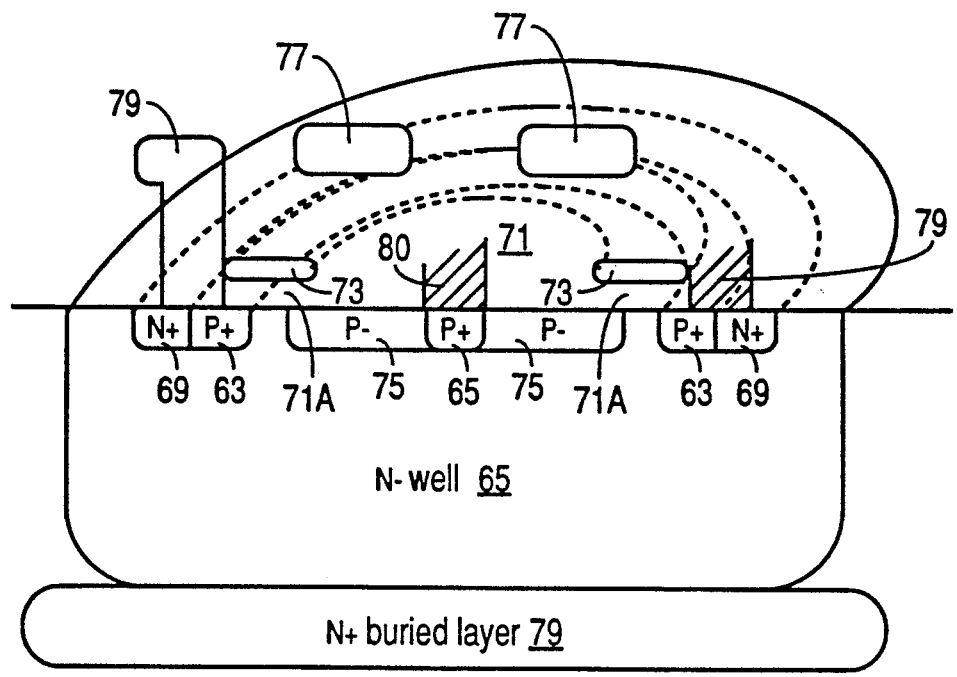
FIG. 13 is a schematic perspective view of an annular embodiment of a MOSFET set in an n-well overlying an n+ buried layer and incorporating the drift electrode of the invention.

Another embodiment of a high voltage LDD MOSFET, shown in FIG. 13 for an annular (closed) arrangement of source, gate and drain, uses a centrally positioned drain region (p+) 65 and a substantially radially symmetric n-well 61, gate 73, oxide region 71, gate oxide 71A, drift region (p−) 75, source region (p+) 63, adjacent oppositely doped region (n+) 69, and drift electrode 77 positioned in or above the n-well with an n+ buried layer 79 below the n-well. A similar embodiment (not shown) may be used, mutatis mutandis, for an annular arrangement in a p-well with a p+ buried layer.

Figure 14:
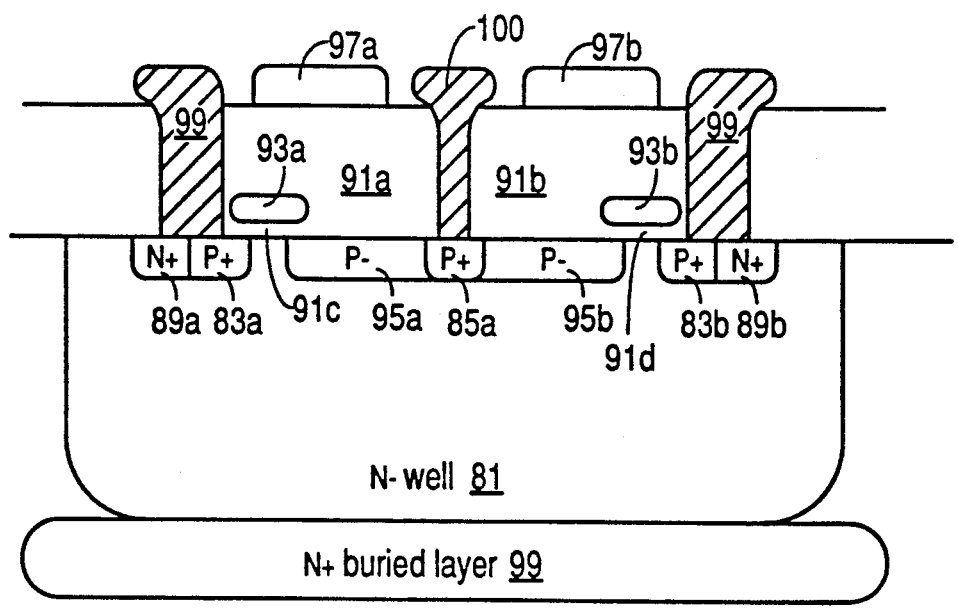
FIG. 14 is a schematic view of a substantially symmetric analog of the embodiment of FIG. 13 for a linear or open geometry.

Another embodiment, high voltage LDD MOSFET shown in FIG. 14, uses a linear or open, substantially symmetric arrangement of source regions 83a and 83b, gates 93a and 93b, oxide regions 91a and 91b, gate oxide regions 91c and 91d, drift regions 95a and 95b, drain region 85 and drift electrodes 97a and 97b that are separated from the drain region 85 by drift gaps of predetermined length d, all set in or above an n-well 81 overlying on n+ buried layer 99. A similar embodiment (now shown), mutatis mutandis, may be used with a p-well overlying a p+ buried layer.

The embodiments of FIGS. 11 and 12 are useful in VLSI circuitry and in multiplexers, analog switches and transmission gates, respectively.

In each instance the drift region is lightly doped, with an effective dopant ion implant does of substantially $5 \times 10^{10} - 5 \times 10^{12}$ dopant atoms cm$^{-2}$, and a gap for the channel exists between at least one end of the drift region and either the source region or drain region or both. If the effective dose is much higher, say $>10^{13}$ dopant atoms cm$^{-2}$, the presence of a drift plate or electrode, charged to an appropriate positive voltage (n-channel) or an appropriate negative voltage (p-channel), will be at best a minor perturbation on the system, and little benefit will accrue from such inclusion. For an n-channel (p-channel) MOSFET, an appropriate voltage applied to the drift plate or electrode might be 3–600 volts.

In order to drive the drift electrode to a potential more positive than the gate potential, a second supply voltage is required. In many power integrated circuits, a high voltage supply ranging from 60 to 600 volts is available. In the event that the high voltage output stage must be capable of sourcing and sinking current (a push-pull output), circuitry is generally available to level shift the low voltage logic signals to a high voltage needed for the p-channel device. Voltages produced by the level shift circuitry can then be used to bias the drift electrode above the drift region of one or both of the n-channel and the p-channel MOSFET.

Figure 15A:
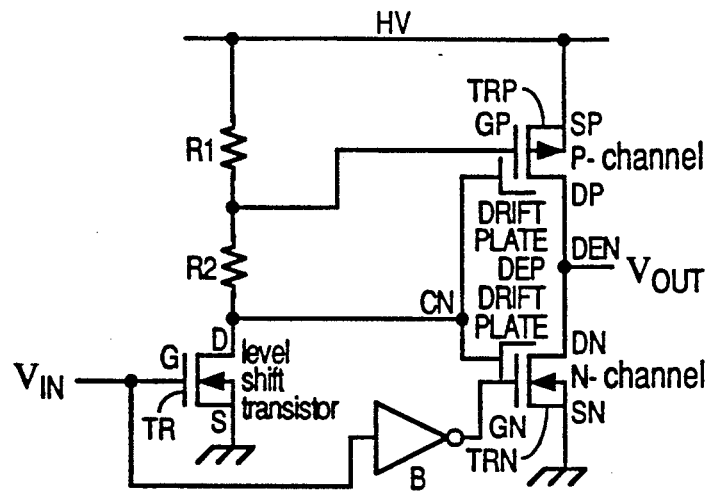
FIGS. 15A, 15B, 15C, 15D and 15E are schematic views of five techniques useful in voltage level shifting in a drift electrode used in the invention.

FIG. 15A shows an implementation of the simplest level shift circuit, relative to a reference voltage level denoted $V_{in}$, where a resistor load inverter drives a high voltage CMOS push-pull output stage. The tap point of the resistor voltage divider is chosen such that the p- channel gate-to-source voltage does not exceed the gate oxide rupture voltage when the PMOS device is on. The common node CN where the resistor and the n-channel level shift transistor are connected is used to drive the drift electrodes over one or both of a pair of n-channel and p-channel output devices.

When the level shift n-channel transistor TR is on in FIG. 15A, the node CN is near ground potential and the output p-channel drift region becomes accumulated, thereby lowering its resistance. Because the node CN is near ground potential, the "off" output n-channel drift is not affected by the potential of the drift electrode DEN and functions as a normal voltage termination. Conversely, when the level shift transistor TR is off, the potentials of the drift electrodes DEP and DEN are at the high supply voltage so as to accumulate the drift of the output n-channel device and lower its on-state resistance, without affecting the drift region of the off-state output p-channel device.

In FIG. 15A, the source SP of the p-channel MOSFET TRN is connected to the high voltage supply HV, and the gate of this MOSFET is connected across a first resistor R1 of predetermined resistance to HV. The common node CN for the two drift electrodes DEN and DEP are connected across a second resistor R2 of predetermined resistance to the gate of the p-channel MOSFET TRP. The resistance value of the resistor R2 may be reduced to zero Ohms so that the electrical potentials of the common node CN and the gate GP of the p-channel MOSFET TRP coincide. The source SN of the n-channel MOSFET TRN is connected through a buffer or buffer-inverter B to the input terminal, denoted $V_{in}$, of the level shift device. The gate G of a level shift input transistor TR is also connected to $V_{in}$, the source S of TR is grounded, and the drain D of TR is connected through the second resistor R2 of predetermined resistance to the gate GP of the p-channel MOSFET TRP and is directly connected to the circuit node CN that is connected to the drift electrodes DEP and DEN of the p-channel and n-channel MOSFETs that are constructed according to the embodiment of the invention discussed above. The drains of these two MOSFETs are connected to the output terminal, denoted $V_{out}$.

Figure 15B:
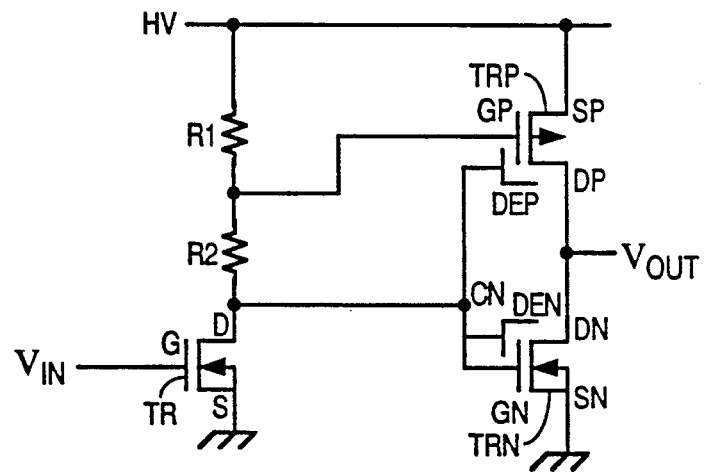

FIG. 15B illustrates an alternative structure for the embodiment of FIG. 15A, wherein the gate GN of the n-channel MOSFET TRN is connected directly to the common node CN so that the electrical potentials of the common node CN and the gate GN of the n-channel MOSFET coincide. With this alternative, the buffer B connecting $V_{in}$ and the gate GN would be removed, and a thicker gate oxide may be required for an N-channel MOSFET.

Figure 15C:
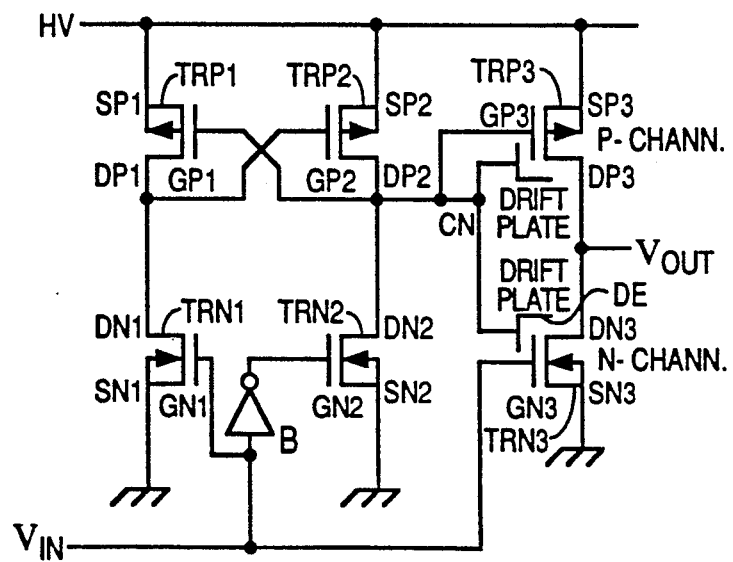

FIG. 15C illustrates a similar technique using a cross-coupled level shift circuit. Here, the same voltage is used to drive the gate and the drift electrode of the output p-channel device and the drift plate of the n-channel device. A configuration of two p-channel transistors TRP1 and TRP2, and two n-channel transistors TRN1 and TRN2, together with the buffer or buffer-inverter B, serves as an initial level shift for the p-channel and the n-channel MOSFETs TRP3 and TRN3, respectively, constructed according to one of the embodiments of the invention. The gate GP1 of transistor TRP1 and the drains DP2 and DN2 of transistors TRP2 and TRN2 are connected to the circuit node CN, and to the drift electrodes DEP and DEN of the p-channel and n-channel MOSFETs TRP3 and TRN3, respectively.

The sources and bodies (N well) of transistors TRP1, TRP2 and the p-channel output MOSFET TRP3 are connected to the high voltage supply HV; and the sources and bodies (P substrate) of transistors TRP1, TRN2 and the n-channel output MOSFET TRN3 are grounded. The drains DP1 and DN1 of transistors TRP1 and TRN1 are connected to the gate of transistor TRP2. The gates GN1 and GN2 of transistors TRN1 and TRN2 are connected across the inverter-buffer B, whose input is connected to the input terminal, denoted $V_{in}$, of the level shift device. The gate of the n-channel output MOSFET TRN3 may be connected to either the input to inverter B or to circuit note CN. The output terminal, denoted $V_{out}$, of the device is connected to the drains of the p-channel and n-channel MOSFETs as shown.

Figure 15D:
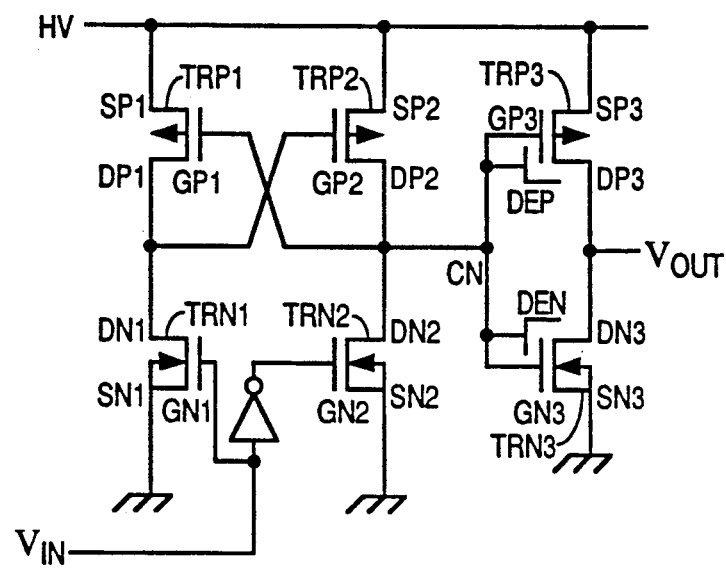

FIG. 15D illustrates an alternative structure for the embodiment of FIG. 15C, wherein the gate GN3 of the n-channel output MOSFET TRN3 is connected directly to the common node CN and the connection of the input terminal $V_{in}$ and the input terminal of the buffer-inverter B to the gate GN of the n-channel output MOSFET TRN3 is removed.

Figure 15E:
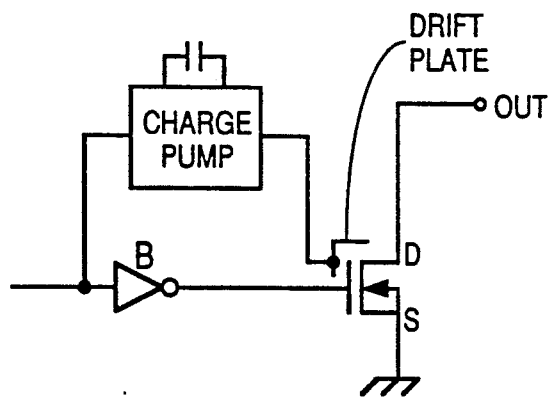

FIG. 15E illustrates a situation where no high voltage supply is available, other than the one in series with the load. In such instance, the highest voltage available to drive the drift electrode DE while the n-channel output transistor TRN is on, is the low voltage supply. This supply voltage may be too low to enhance the drift conductivity. Here, a separate charge-pump circuit may be employed to create a higher supply voltage and is switched on or connected to the drift electrode only when the output n-channel MOSFET gate is turned on. The charge-pump circuitry requires additional area on a chip, however, and may not be cost effective in every application. The notion of a charge pump, or of a circuit that will generate a voltage higher than the supply that drives it was introduced many years ago and is discussed, for example, by Dickson in "On-chip High-voltage Generation in MNOS Integrated Circuits Using an Improved Voltage Multiplier Technique", I.E.E.E. Jour. of Solid-state Circuits, vol. SC-11 (1976) 374–378. This article is incorporated by reference herein.

The drift electrode technique can be used on low voltage VLSI devices or similar high voltage transistors where the drift is present on both the source and drain sides, by extending metal biased at or near the gate potential over both the drain and source sides of the MOSFET. By enhancing the drift conductivity while the transistor is on, not only is the series resistance decreased, but the amount of source degeneration is reduced as well.

Although the preferred embodiments of the invention have been shown and described herein, variation and modification may be made without departing from the scope of the invention.

We claim:

1. A method for reducing the on-state resistance and improving the current characteristics of a MOSFET, the method comprising the steps of:
   providing a substrate region of first electrical conductivity type that has a top surface;
   forming source and drain regions, each more heavily doped than said substrate region, of second electrical conductivity type, spaced apart from each other and each forming a part of said top surface of said substrate region;

forming a body region of second conductivity type material doped at a level intermediate that of said substrate region and said source region, surrounding said source region and forming a part of said top surface of said substrate region, so that said source region becomes an island in said body region;

forming an oxide region having a top surface, being adjacent to said top surface of said substrate region, overlying at least a portion of said source and drain regions and overlying substantially all of said substrate region that lies between said source and drain regions;

forming a drift region positioned between said source and drain regions and forming a part of said top surface of said substrate region, spaced apart from at least one of said source region and said drain region and defining a gap therebetween, and forming a part of said top surface of said substrate region, said drift region being of second conductivity type;

forming a gate overlying at least a portion of said gap and being positioned within the interior of said oxide region and overlying a portion of said substrate region that lies between said source and drain regions;

electrically connecting said gate for impressing a voltage on said gate;

forming a second oxide region, positioned between said gate and a portion of said top surface of said substrate region;

forming a first electrical contact contiguous to said source region, a second electrical contact contiguous to said drain region, and a third electrical contact contiguous to said gate;

forming a drift electrode of electrically conducting material positioned adjacent to said top surface of said oxide region, overlying at least a portion of said drift region and at most only a portion of said gate and having a voltage impressed on said drift electrode, to enhance the conductivity of said drift region when the MOSFET is on and to suppress the conductivity when the MOSFET is not on; and electrically connecting said drift electrode for impressing a first voltage on the drift electrode when the MOSFET is on and to impress a second voltage that differs from the first voltage when the MOSFET is not on, the first voltage being more positive than the voltage impressed on said gate.

2. Method of claim 1, wherein said drift electrode is spaced apart from shad second electrical contact and from said third electrical contact by a distance of at least about two μm.

3. Method of claim 1, further including the step of forming a drain plate that is electrically conducting, is electrically connected to said drain region, is positioned so that said drain plate overlies all or a portion of said drain region, and extends toward said source region.

4. Method of claim 1, further including the step of maintaining said drift electrode at substantially ground potential.

5. Method of claim 1, further including the step of maintaining said drift electrode at least at about a voltage of said gate.

6. Method of claim 1, further comprising the steps of:
forming a source extension region contiguous to said source region, positioned under and adjacent to said oxide region and extending toward but being spaced apart from said drain region, said source extension region being contiguous to said source region and being of second conductivity type;

forming a drain extension region contiguous to said drain region, positioned under and adjacent to said oxide region and extending toward but being spaced apart from said source region and said source extension region, said drain extension being contiguous to said drain region and of second conductivity type; and where said gate is positioned so that it overlies substantially all of said substrate region that lies between said source extension region and the drain extension region.

7. Method of claim 6, further comprising the step of forming a body contact region of first conductivity type, positioned contiguous to said source region, to said first electrical contact and to said substrate region.

8. Method of claim 6, further comprising the step of forming a spacer oxide region, including an oxide of polysilicon, surrounding said gate and positioned within said interior of said oxide region, where said source region and said drain region are self-aligned using the spacer oxide region.

9. Method of claim 1, further comprising the steps of:
forming a first source extension region of said source region, positioned under and adjacent to said oxide region and extending toward but being spaced apart form said drain region, with the source extension region being contiguous to said source region and being of second electrical conductivity type;

forming a second source extension region of said source region, positioned under and adjacent to said oxide region contiguous to said source region and extending away from said drain region and being of second electrical conductivity type;

forming a first drain extension region of said drain region, positioned under and adjacent to said oxide region and extending toward but being spaced apart from said source region and said source extension region, with said drain extension region being contiguous to said drain region and being of second electrical conductivity type;

forming a second drain extension region of said drain region, positioned under and adjacent to said oxide region and contiguous to said drain region and extending away form said source region and being of second electrical conductivity type; and wherein said gate overlies substantially all of said drift region that lies between said first source extension region and said first drain extension region.

* * * * *